United States Patent [19]

Deambrosio et al.

[11] Patent Number: 4,973,244

[45] Date of Patent: * Nov. 27, 1990

[54] HEATING SYSTEM IN THE MANUFACTURE OF PRINTED CIRCUIT BOARDS, ASSEMBLIES AND THE LIKE

[75] Inventors: Carlos Deambrosio, Laprairie; Francois Parent, Montreal; Alexander Tsarevsky, Cote St-Luc, all of Canada

[73] Assignee: Electrovert Limited, Quebec, Canada

[*] Notice: The portion of the term of this patent subsequent to Nov. 27, 2007 has been disclaimed.

[21] Appl. No.: 204,015

[22] Filed: Jun. 8, 1988

[51] Int. Cl.$^5$ .......................... F27D 3/00; F27D 13/00
[52] U.S. Cl. ............................................. 432/11; 432/8; 432/59; 432/230; 432/234; 198/838
[58] Field of Search ............... 432/8, 59, 234, 230; 228/37, 43, 180.1, 180.2, 9, 46; 198/952, 838

[56] References Cited

U.S. PATENT DOCUMENTS

| | | | |
|---|---|---|---|
| 3,107,778 | 10/1963 | Jordan | 198/838 X |
| 3,124,239 | 3/1964 | Kornylak | 198/838 |
| 3,857,690 | 12/1974 | Zappia | 432/230 |
| 4,338,078 | 7/1982 | Lampkin | 432/11 |
| 4,486,172 | 12/1984 | Dunning | 432/11 |
| 4,504,008 | 3/1985 | Kent et al. | 228/46 X |
| 4,832,249 | 5/1989 | Ehler | 228/9 |
| 4,838,412 | 6/1989 | Backman | 198/838 |

Primary Examiner—Henry A. Bennet
Assistant Examiner—Christopher B. Kilner
Attorney, Agent, or Firm—Darby & Darby

[57] ABSTRACT

Printed circuit boards, assemblies and the like are heated uniformly from edge to edge or to a desired lateral temperature profile while being conveyed through a heating area. The conveying systems reliably conveys circuit boards and the like through the heating area without dropping them. A rail heater is provided to heat rails supporting conveyors having pins to hold circuit boards and the like. A control for the rail heaters controls the temperature of the rails so the circuit boards are positively supported on the conveyors and have a uniform temperature profile or desired temperature profile from edge to edge.

13 Claims, 2 Drawing Sheets

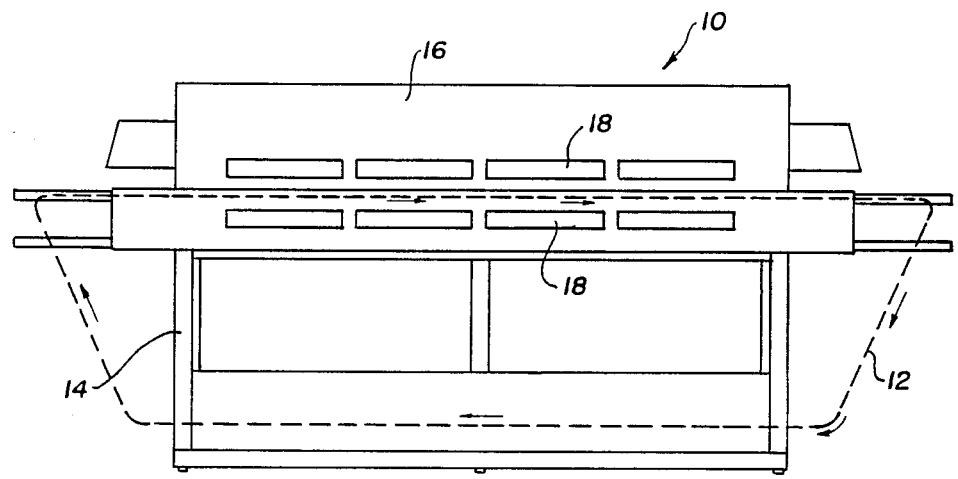
PRIOR ART   FIG.1.
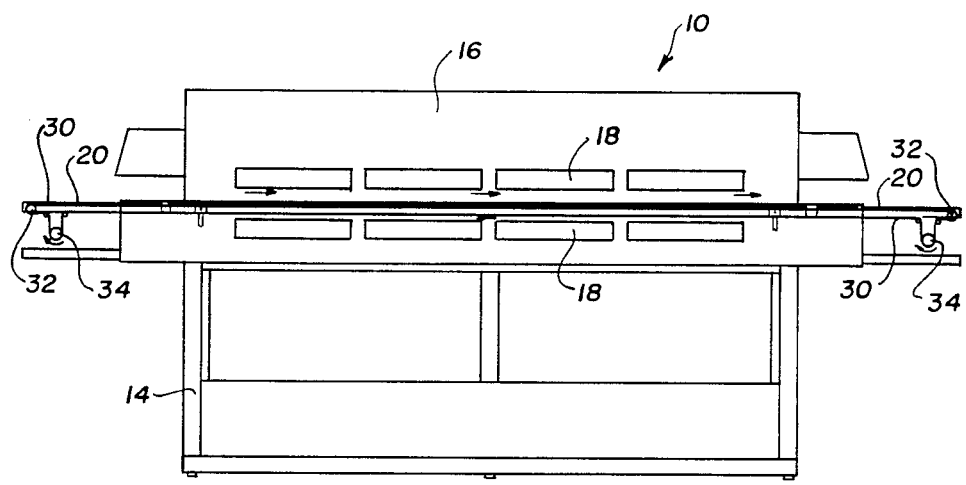
FIG.2.

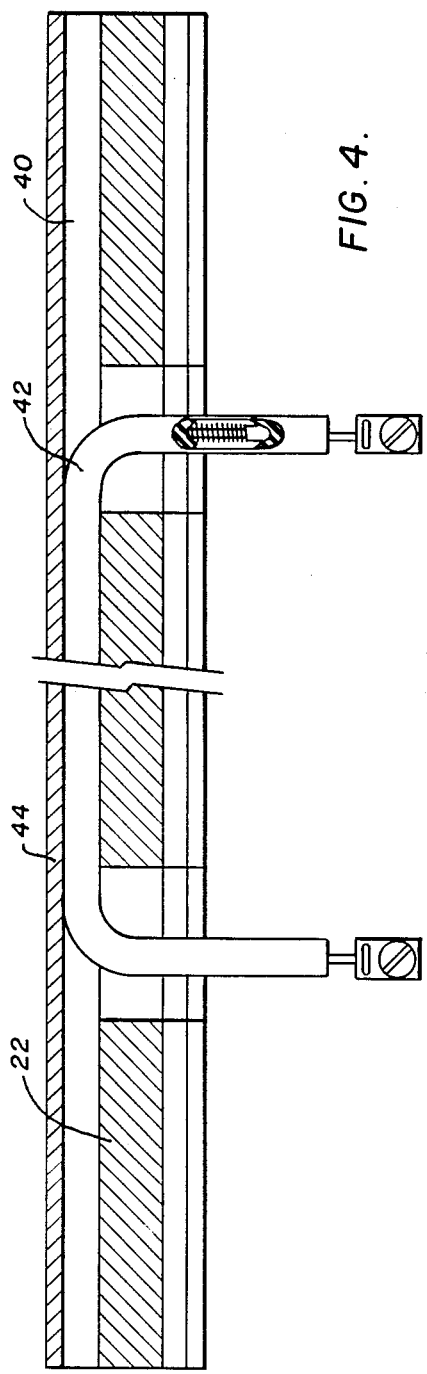
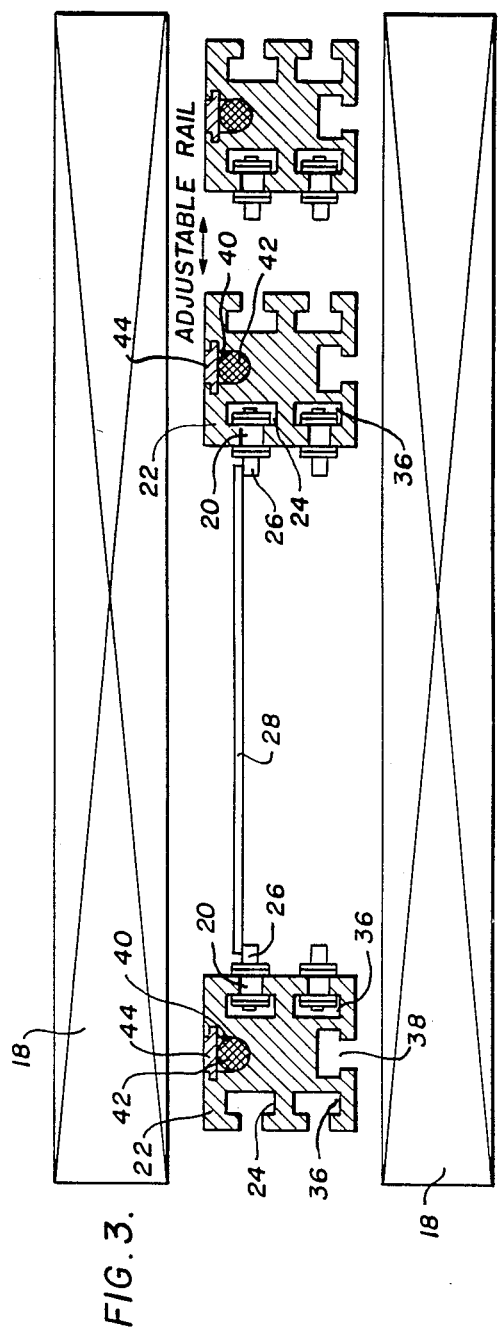

HEATING SYSTEM IN THE MANUFACTURE OF PRINTED CIRCUIT BOARDS, ASSEMBLIES AND THE LIKE

FIELD AND BACKGROUND OF THE INVENTION

The present invention relates to the heating of printed circuit boards, assemblies and the like and more specifically to uniformly heating circuit boards from edge to edge or a desired lateral temperature profile, while being conveyed through a heating area. The present invention also relates to reliably conveying circuit boards, assemblies and the like through heating areas.

In the past, printed circuit boards, assemblies and the like were placed on a flat mesh conveyor belt and conveyed through a series of heating areas or zones. In some cases the heating areas have infrared quartz tubes at very high temperatures. In another instance, flat infrared panel preheaters are provided at more moderate temperatures. The heating devices are used for ceramic substrate firing, for solder reflow of tin/lead electroplate on bare boards, or surface mount soldering on ceramic substrates or conventional board laminates. The term "circuit boards" is used throughout the specification and includes all of the different assemblies described above. In the past, the circuit boards were normally placed by hand or automatically fed to the center of the mesh belt to eliminate the problems of the edges of the belts being either hotter or cooler than the center.

With automation, the flat mesh conveyor belt is replaced by two separate conveyor chains positioned parallel and spaced apart having small pins, tabs or the like to support and convey the circuit boards. The distance between the two conveyors may be varied to suit the size of the circuit boards. This arrangement permits minimum handling of the circuit boards and the machines become integrated to and from each other with the pin/chain conveyors.

Because these conveyors have to be adjustable for different widths, it is generally necessary to pass the rails supporting the conveyors within the heated areas and this can cause problems because the chain conveyors have to extend outside the heating areas and tend to cool. The cold chain conveyors recontact the hot support rails, which can cause the rails to expand unevenly resulting in warping. The conveyors tend to drop the printed circuit boards if the pins on the chain conveyors separate.

In one case efforts have been made to prevent this warping by providing a cooling fluid in the rails to keep them straight and thus prevent them dropping boards. However, this provides a temperature difference between the rails and the circuit board which can result in non uniform temperature profiles across the circuit boards.

In another case attempts have been made to hold the rails straight with heavy clamps. However, adjustments of the rail widths is difficult and time consuming and temperature restabilization has not been successful.

If the rails become too large, and are made of heat conductive materials such as steel or aluminum, then heat is taken by the rails from the quartz heaters or panel heaters resulting in a non uniform temperature profile across the board. This results in a risk of overheating in the center of the boards and/or incomplete solder joints along the edges of the boards where they are cooler because of the presence of the rail and the conveyor.

Attempts have been made to overcome these problems by providing a supplementary heater to heat the side edges of the circuit board. However, by utilizing a supplementary quartz tube heater it was found that not only did it heat the board edge, but also the chain conveyors and the rails. In order to maintain non-distortions in the rail, and a uniform temperature profile of the circuit board it was still necessary to provide cooling within the rail, otherwise uniformity cannot be obtained

SUMMARY OF THE INVENTION

It has been found that if the conveyors are either kept hot or are preheated prior to contacting the rail, to support and guide the conveyors through the heating areas, then distortion of the rail to such an extent that boards drop, does not occur. Furthermore, if the rails within the heating area are controllably heated by separate rail heaters, then the temperature of the rails in the heating areas can be controlled so the combination of rails and conveyors do not heat or cool the edges of a circuit board and the circuit boards have a thermally uniform lateral profile from edge to edge.

The present invention provides a method for ensuring printed circuit boards, assemblies or the like are uniformly heated thereacross by a heater means while being conveyed by a conveyor means adjacent the heater means, comprising the steps of: (a) providing a conveyor means for transporting said printed circuit boards, assemblies or the like, adjacent a first heater means for heating said printed circuit boards, assemblies or the like uniformly thereacross; (b) providing a second heater means for positively heating said conveyor means whereby said conveyor means does not cause non-uniform heating of said printed circuit boards, assemblies or the like thereacross; and (c) operating said second heater means to positively heat said conveyor means.

There is also provided a method for preventing distortion of support means for a movable flexible conveyor means, resulting in malfunction of the conveyor means, the support means and the conveyor means being heated during heating of printed circuit boards, assemblies or the like, transported on the conveyor means adjacent a heater means, said distortion resulting from said conveyor means when in cooled down condition recontacting said heated support means, comprising the steps of (a) providing a further support means remote from said heater means for supporting said heated conveyor means; and (b) guiding said conveyor means by said further support means whereby to maintain said conveyor means in heated condition, and whereby to prevent distortion of said heated support means when recontacted by said conveyor means.

In yet a further embodiment, the present invention provides in an apparatus for heating printed circuit boards, assemblies or the like, wherein the boards are conveyed through at least one heating area having a board heating means therein, including at least two parallel spaced apart chain conveyors, each of the conveyors supported and guided by an elongated rail extending through the heating area, the chain conveyors having circuit board holding means to hold and convey the boards, the improvement comprising: rail heating means for each rail, and control means for the rail heating means to control the temperature of each rail extending through the heating area so the circuit boards are positively supported and have a thermally uniform profile across the boards while being conveyed through the heating area.

In other embodiments the elongated rail is formed of heat conductive material, preferably aluminum alloy and the chain conveyors pass in slots in the elongated rail when both conveying and returning, thus ensuring that the chain conveyor is kept heated during the conveying and return stage.

In a preferred embodiment, the rail heater is a rod type heater embedded within the rail and extending at least through the heating area and the rail has a symmetrical cross section about a vertical axis, with a top slot and a bottom slot on each side, thus being interchangeable from one side to the other.

In a further embodiment, a heater is provided to preheat the conveyor chains before contacting the elongate rail.

The present invention also provides in a method of heating printed circuit boards, assemblies or the like wherein the circuit boards are held and conveyed by at least two parallel spaced apart chain conveyors through at least one heating area having board heating means therein, each of the conveyors supported and guided by an elongate rail extending through the heating area, the improvement comprising the steps of heating each elongate rail throughout the heating area by a separate rail heating means, and controlling the rail heating means so the circuit boards held by the conveyors have a thermally uniform profile across the boards while being conveyed through the heating area.

BRIEF DESCRIPTION OF THE DRAWINGS

The invention is illustrated by way of examples in the accompanying drawings wherein:

FIG. 1 is a schematic elevational view showing an infrared heating machine for printed circuit boards as known in the prior art;

FIG. 2 is a schematic elevational view showing an infrared heating machine for printed circuit boards having a rail heating system according to the present invention;

FIG. 3 is a detailed cross sectional view across two rails and chain conveyors holding a printed circuit board;

FIG. 4 is a partial longitudinal sectional view showing a heater within a rail;

DESCRIPTION OF THE PREFERRED EMBODIMENTS

An infrared heating machine 10 is shown in FIG. 1 as known in the prior art. The machine 10 has a conveyor 12 supported on frame 14 for conveying printed circuit boards through heating areas 16 having top and bottom heating panels 18. As can be seen, once the conveyor 12 leaves the heating area, it returns underneath the heating areas 16, thus the chain conveyor cools during its return and before re-entering the heating areas 16.

FIG. 2 illustrates a heating device similar to that shown in FIG. 1, but having two chain conveyors 20 as illustrated in more detail in FIG. 3. Extruded aluminum alloy elongated rails 22 have a top slot 24 to support and guide each chain conveyor 20 which in turn has pins 26 extending inwards to support a printed circuit board 28. The pins 26 are preferably as short as possible so they provide minimum contact with the circuit boards 28. If the pins are made longer, while they may prevent the boards 28 falling off the conveyors 20, they interfere with edge or side mounting components.

The rails 22 are parallel and on the same horizontal elevation. As can be seen, at least one rail 22 is adjustable to take into account different board widths. The adjustment may be automatic operated remotely.

As can be seen in FIG. 2, the rails 22 are divided into three portions, two end portions 30 which are not heated and, in addition to acting as load/unload zones, also guide the chain conveyor 20 to drive sprockets 32 and tensioning sprockets 34. The center rail portion extends through the heating areas 16 between the heating panels 18.

As seen in FIG. 3, the aluminum rail 22 is made symmetrical about its vertical center axis with a top slot 24 to support and guide the conveyor chain 20 and a bottom slot 36 to support and guide the returning chain. Similarly, the top slots 24 and bottom slots 36 are provided on the other side of the aluminum rail 22, thus the aluminum rail 22 can be interchanged when two slots wear out, and furthermore, the rail section becomes a single unit usable on the left or the right hand side of the machine. A location slot 38 allows the rail to be mounted on suitable mounting brackets which may be motorized for moving the adjustable rail to the left or the right and thus change the width for the circuit boards 28 as desired.

A groove 40 in the top of the rail 22 contains a steel jacketed cal-rod heater 42 as illustrated in FIG. 4. A cover 44 is shown on top of the heater 42 to ensure that the heat from the heater 42 is transferred through the rail 22 to the chain conveyor 20. Thus a uniform distribution of heat between the rail and the chain conveyor 20 results. The heater 42 extends for the heating areas 16 of the machine 10 and inasmuch as the rail is aluminum and has good thermal conductive properties, the heater 42 attempts to keep the temperature of the rail 22 substantially even from end to end, even including the two end portions as shown in FIG. 4 which extend out beyond the heater.

The chain conveyor 20 is supported and guided in the top slot 24 of the rail 22 and returns in the bottom slot 36. Thus the conveyor 20 stays inside the heating area for most of its travel and retains its heat. The temperature drop of the chain conveyor leaving one slot and returning to the other slot at both ends of the rail 22 is kept to a minimum and is not sufficient for the chain conveyor 20 to cool sufficiently for rail distortion to occur and allow the boards to drop.

In the heating area 16 illustrated in FIG. 2, panel heaters 18 in different zones may have different temperatures however, the zone where solder melts or ceramic substrates are fixed is the zone that the printed circuit boards 28 must have a thermally uniform profile from edge to edge. Thus the temperature of the tubular heating element is controlled with that of the heating panels or quartz tubes within that particular zone so there is preferably no heat differential between the center of the board 28 and the edges of the board due to the mass of the rail and chain conveyor 20.

A thermocouple (not shown) is provided in the rail 22 so that the temperature of the rail 22 is measured and the thermocouple is used with a separate controller to control the temperature in each rail 22 so that it is similar in both rails and also in accordance with the board heaters or quartz heaters in the key heating area. As can be seen in FIG. 3, there is minimum contact between the board 28 and the pins 26 on the chain conveyor 20 and when the rail 22 and chain conveyor 26 are at the same temperature as that required for the circuit board 28, then there is substantially no transfer of heat either up or down between the board 28 and the combination of the rails 22 and the conveyor 26. Thus the board 28 has a thermally uniform profile right across from edge to edge.

In another embodiment the temperature of the rail heaters may be controlled so that there is a specifically required temperature profile across the board from edge to edge. With either a higher or lower temperature at one or both edges depending upon the desired profile.

The controller for controlling temperature of the rail heater 42 can be varied to suit the heat in a particular zone, however, the zone where the solder melts or the ceramic material is fired is the zone where there should be substantially no transfer of heat between the board 28 and the combination of the conveyor 26 and rail 22. The temperature of the rail 22 stays substantially uniform throughout the length of the central portion, even though the rail 22 may have a higher temperature than some of the preheat zones.

Various changes may be made to the embodiments described herein without departing from the scope of the present invention which is limited only by the following claims.

The embodiments of the invention in which an exclusive property or privilege is claimed are defined as follows.

1. A method for ensuring printed circuit boards and assemblies are uniformly heated thereacross by a heater means while being conveyed by a conveyor means adjacent the heater means, comprising the steps of:
   (a) providing a conveyor means for transporting said printed circuit boards and assemblies adjacent a first heater means for heating said printed circuit boards and assemblies uniformly thereacross;
   (b) providing a second heater means for positively heating said conveyor means whereby said conveyor means does not cause non-uniform heating of said printed circuit boards and assemblies thereacross; and
   (c) operating said second heater means to positively heat said conveyor means.

2. A method for preventing distortion of support means for a moveable flexible conveyor means, said distortion resulting in malfunction of the conveyor means, the support means and the conveyor means being heated during heating of printed circuit boards and assemblies transported on the conveyor means adjacent a heater means, said distortion resulting from said conveyor means when in cooled down condition recontacting said heated support means, comprising the steps of:
   (a) providing a further support means remote from said heater means for supporting said heated conveyor means, said further support means having a second heater means associated therewith; and
   (b) guiding said conveyor means by said further support means whereby to maintain said conveyor means in heated condition, and whereby to prevent distortion of said heated support means when recontacted by said conveyor means.

3. In an apparatus for heating printed circuit boards and assemblies, wherein the boards are conveyed through at least one heating area having a board heating means therein, including at least two parallel spaced apart chain conveyors, each of the conveyors supported and guided by an elongated rail formed of heat conductive material extending through the heating area, said heat conductive material being aluminum alloy, the chain conveyors having circuit board holding means to hold and convey the boards;
   the improvement comprising:
   rail heating means for each rail, and
   control means for the rail heating means to control the temperature of each rail extending through the heating area so the circuit boards are positively supported and have a thermally uniform profile across the boards while being conveyed through the heating area.

4. In an apparatus for heating printed circuit boards and assemblies, wherein the boards are conveyed through at least one heating area having a board heating means therein, including at least two parallel spaced apart chain conveyors, each of the conveyors supported and guided by an elongated rail extending through the heating area, the chain conveyors having circuit board holding means to hold and convey the boards;
   the improvement comprising:
   rail heating means for each rail, and
   control means for the rail heating means to control the temperature of each rail extending through the heating area so the circuit boards are positively supported and have a thermally uniform profile across the boards while being conveyed through the heating area,
   wherein the chain conveyors each pass in a top slot of each elongated rail when holding and conveying the boards and return in a bottom slot of each elongated rail, with chain sprockets at each end of the rail.

5. The apparatus according to claim 4 wherein the elongated rail has a symmetrical cross section about a vertical axis with a top slot and a bottom slot on each side, thus being interchangeable from one edge of the board to the other edge.

6. The apparatus according to claim 3 wherein the rail heating means comprises a rod type heater embedded within each rail and extends at least through the heating area.

7. The apparatus according to claim 3 including a second elongated rail upstream of the heating area for each of the chain conveyors to provide a loading area and a third elongated rail downstream of the heating area for each of the chain conveyors to provide an unloading area, the chain conveyors passing through the second rail, the rail extending through the heating area and the third rail.

8. In a method of heating printed circuit boards and assemblies, wherein the circuit boards are held and conveyed by at least two parallel spaced apart chain conveyors through at least one heating area having board heating means therein, each of the conveyors supported and guided by an elongated rail extending through the heating area, the improvement comprising the steps of:
   heating each elongated rail throughout the heating area by a separate rail heating means,
   passing the chain conveyors through first guide slots in the elongated rails when holding and conveying the circuit boards and returning the chain conveyors through the second guide slots in the elongated rails so the chain conveyors are heated when conveying and when returning such that the difference in temperature between the chain conveyors and the elongated rails is not sufficient to distort the elongated rail and cause the circuit boards to fall off the chain conveyor, and controlling the rail heating means so the circuit boards held by the conveyors have a thermally uniform profile across the boards while being conveyed through the heating area.

9. The method according to claim 8 wherein the circuit boards are conveyed through a plurality of heating areas, and each elongated rail passes through the plurality of heating areas, including the steps of heating the elongated rail by a separate rail heating means so that the temperature of the rail is substantially the same throughout the plurality of heating areas, and controlling the rail heating means so the circuit boards held by the conveyors have a thermally uniform profile across the boards while being conveyed through at least one of the plurality of heating areas, and substantially no heat transfer occurs between the boards and the combination of chain conveyor and rail in that least one of the plurality of heating zones.

10. In a method of heating printed circuit boards and assemblies, wherein the circuit boards are held and conveyed by at least two parallel space apart chain conveyors through at least one heating area having board heating means therein, each of the conveyors supported and guided by an elongated rail extending through the heating area, the improvement comprising the steps of:

heating each elongated rail throughout the heating area by a separate rail heating means, and controlling the rail heating means so the circuit boards held by the conveyors have a predetermined temperature profile from edge to edge across the boards while being conveyed through the heating area.

11. The apparatus according to claim 4 wherein the rail heating means comprises a rod type heater embedded within each rail and extends at least through the heating area.

12. The apparatus according to claim 4 including a second elongated rail upstream of the heating area for each of the chain conveyors to provide a loading area and a third elongated rail downstream of the heating area for each of the chain conveyors to provide an unloading area, the chain conveyors passing through the second rail, the rail extending through the heating area and the third rail.

13. In an apparatus for heating printed circuit boards and assemblies, wherein the boards are conveyed by conveying means through at least one heating area having a board heating means therein, including support means for supporting the conveying means, said support means extending through the heating area, the conveying means having circuit board holding means to hold the circuit boards while being conveyed;

the improvement comprising:

support heating means for heating the support means, and control means for the support heating means to control the temperature of the support means extending through the heating area so the circuit boards are positively supported and have a thermally uniform profile across the boards while being conveyed through the heating area.

* * * * *